(12) United States Patent
Suzuki

(10) Patent No.: US 7,713,876 B2
(45) Date of Patent: May 11, 2010

(54) METHOD FOR INTEGRATING A RUTHENIUM LAYER WITH BULK COPPER IN COPPER METALLIZATION

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 654 days.

(21) Appl. No.: 11/238,756

(22) Filed: Sep. 28, 2005

(65) Prior Publication Data

US 2007/0072415 A1      Mar. 29, 2007

(51) Int. Cl.
    *H01L 21/44*        (2006.01)
(52) U.S. Cl. .............. 438/686; 438/652; 438/678; 438/681; 438/687; 257/E21.17; 427/96.8
(58) Field of Classification Search .......... 438/678, 438/652, 681, 686, 687; 427/96.8; 257/E21.17; 428/96.8
    See application file for complete search history.

(56) References Cited

U.S. PATENT DOCUMENTS

| | | | |
|---|---|---|---|
| 4,348,263 A * | 9/1982 | Draper et al. ............... 205/50 |
| 5,130,172 A * | 7/1992 | Hicks et al. ............... 427/584 |
| 5,637,533 A | 6/1997 | Choi |
| 6,001,730 A * | 12/1999 | Farkas et al. ............... 438/627 |
| 6,063,705 A * | 5/2000 | Vaartstra ............... 438/681 |
| 6,069,068 A * | 5/2000 | Rathore et al. ............... 438/628 |
| 6,074,945 A * | 6/2000 | Vaartstra et al. ............... 438/681 |
| 6,258,707 B1 * | 7/2001 | Uzoh ............... 438/618 |
| 6,287,435 B1 | 9/2001 | Drewery et al. ......... 204/298.09 |
| 6,617,248 B1 | 9/2003 | Yang ............... 438/686 |
| 6,630,387 B2 * | 10/2003 | Horii ............... 438/396 |
| 6,713,373 B1 | 3/2004 | Omstead ............... 438/608 |
| 6,734,100 B2 | 5/2004 | Park et al. ............... 438/686 |
| 6,737,313 B1 * | 5/2004 | Marsh et al. ............... 438/240 |
| 6,750,092 B2 | 6/2004 | Won et al. ............... 438/239 |
| 6,787,449 B2 * | 9/2004 | Marsh ............... 438/627 |
| 6,849,122 B1 | 2/2005 | Fair |
| 6,858,535 B2 | 2/2005 | Marsh ............... 438/667 |
| 6,974,768 B1 * | 12/2005 | Kailasam ............... 438/625 |
| 6,989,457 B2 * | 1/2006 | Kamepalli et al. ............ 556/11 |
| 7,107,998 B2 * | 9/2006 | Greer et al. ............... 134/22.1 |
| 7,211,509 B1 | 5/2007 | Gopinath et al. |
| 7,253,109 B2 * | 8/2007 | Ding et al. ............... 438/685 |

(Continued)

FOREIGN PATENT DOCUMENTS

EP      1361605      11/2003

OTHER PUBLICATIONS

European Patent Office, International Search Report and Written Opinion for corresponding PCT Application No. PCT/8S2006/026688, dated Feb. 28, 2007, 9 pgs.

(Continued)

*Primary Examiner*—Matthew C Landau
*Assistant Examiner*—Colleen E Snow
(74) *Attorney, Agent, or Firm*—Wood, Herron & Evans, LLP

(57) ABSTRACT

A method for integrating a Ru layer with bulk Cu in semiconductor manufacturing. The method includes depositing a Ru layer onto a substrate in a chemical vapor deposition process, modifying the deposited Ru layer by oxidation, or nitridation, or a combination thereof, depositing an ultra thin Cu layer onto the modified Ru layer, and plating a Cu layer onto the ultra thin Cu layer.

21 Claims, 8 Drawing Sheets

U.S. PATENT DOCUMENTS

| | | | |
|---|---|---|---|
| 7,341,946 B2* | 3/2008 | Kailasam et al. ............ | 438/687 |
| 2001/0013617 A1* | 8/2001 | Toyoda et al. ............... | 257/301 |
| 2002/0013052 A1 | 1/2002 | Visokay | |
| 2003/0036242 A1* | 2/2003 | Yang .......................... | 438/396 |
| 2004/0105934 A1* | 6/2004 | Chang et al. ........... | 427/255.28 |
| 2004/0108217 A1* | 6/2004 | Dubin ........................ | 205/291 |
| 2005/0081882 A1 | 4/2005 | Greer et al. .................. | 134/1.1 |
| 2005/0098440 A1* | 5/2005 | Kailasam et al. ............ | 205/183 |
| 2005/0110142 A1 | 5/2005 | Lane et al. .................. | 257/751 |
| 2005/0186341 A1 | 8/2005 | Hendrix et al. .......... | 427/248.1 |
| 2006/0033678 A1* | 2/2006 | Lubomirsky et al. .......... | 345/32 |
| 2006/0177601 A1 | 8/2006 | Park et al. | |

OTHER PUBLICATIONS

S. G. Malhotra et al., Integration of Direct Plating of Cu onto a CVD Ru Liner, Conference Proceedings of 2004 Advanced Metallization Conference, Sep. 28-29, 2004 in Tokyo, Japan and Oct. 19-21, 2004 in San Diego, CA, pp. 525-530, XP008067596, Materials Research Society.

Oh-Kyum Kwon et al., PEALD of a Ruthenium Adhesion Layer for Copper Interconnects, Online Database Inspec, The Institute of Electrical Engineers, Stevenage, GB, Dec. 2004, Database Accession No. 8185118 and Journal of the Electrochemical Society Electrochem. Soc USA, Dec. 2004, pp. 753-756, vol. 151, No. 12, XP002413373.

Q. Wang et al., Low-Temperature Chemical Vapor Deposition anf Scaling Limit of Ultrathin Ru Films, Applied Physics Letters, American Institute of Physics, Melville, NY, Feb. 23, 2004, pp. 1380-1382, vol. 84, No. 8, XP012062189.

I. Goswami et al., Transition Metals Show Promise as Copper Barries, Semiconductor International, Cahners Pub, Newton, Mass, May 2004, pp. 49-54, vol. 27, No. 5, XP008072872.

U.S. Patent and Trademark Office, Office Action issued for related U.S. Appl. No. 11/238,500 dated Jun. 4, 2007, 19 pgs.

* cited by examiner

METHOD FOR INTEGRATING A RUTHENIUM LAYER WITH BULK COPPER IN COPPER METALLIZATION

FIELD OF THE INVENTION

The present invention relates to semiconductor processing, and more particularly, to a method for integrating a ruthenium layer with bulk copper in copper metallization.

BACKGROUND OF THE INVENTION

The use of copper (Cu) metal in multilayer metallization schemes for manufacturing integrated circuits requires the use of a diffusion barrier layer to promote adhesion and growth of the Cu layers and to prevent diffusion of Cu into the dielectric materials. Barrier layers that are deposited onto dielectric materials can include refractive materials, such as tungsten (W), molybdenum (Mo), and tantalum (Ta or TaN), that are non-reactive and immiscible in Cu, and can offer low electrical resistivity.

More recently, ruthenium (Ru) metal has been identified as a potential barrier layer for copper metallization since it is expected to behave similarly to the above-mentioned refractory metals. Furthermore, it is possible that a single Ru layer can replace current barrier layers, including TaN/Ta bilayers. In addition, recent research has suggested that a bulk Cu deposition can be performed by direct Cu plating onto a Ru layer without depositing a Cu seed layer onto the Ru layer. However, the as-deposited Ru layer may contain contaminants, for example due to by-products from the Ru deposition process that may become incorporated into the Ru layer, that can result in unacceptable properties for the Ru layer when it is integrated into Cu metallization schemes. These properties include insufficient resistance to Cu diffusion through the Ru layer, poor Cu plating uniformity over the whole substrate (e.g., 200 mm, 300 mm, or even larger wafers) that subsequently can lead to problems during planarization of the substrate by chemical mechanical polishing (CMP), weak adhesion between the bulk Cu layer and the Ru layer that can result in electro-migration (EM) and stress-migration (SM) problems, as well as reduced device production yields. Thus, new processing methods are needed for improving the properties and integration of Ru layers into Cu metallization schemes.

SUMMARY OF THE INVENTION

A method is provided for integrating a Ru layer with bulk Cu in semiconductor manufacturing. The method includes depositing a Ru layer onto a substrate in a chemical vapor deposition process, modifying the deposited Ru layer by oxidation, or nitridation, or a combination thereof, depositing an ultra thin Cu layer onto the modified Ru layer, and plating a bulk Cu layer on the ultra thin Cu layer.

DETAILED DESCRIPTION OF SEVERAL EMBODIMENTS OF THE INVENTION

Embodiments of the invention provide a method for integrating a Ru layer with bulk Cu in semiconductor manufacturing. Embodiments of the invention can reduce or eliminate problems with Ru layers in Cu interconnect metallization schemes associated with insufficient resistance to Cu diffusion through the Ru layer and poor Cu plating uniformity over the whole substrate. Furthermore, embodiments of the invention can improve adhesion between the plated bulk Cu layer and the underlying Ru layer, reduce electro-migration (EM) and stress-migration (SM) problems, and improve device production yields.

In the following description, in order to facilitate a thorough understanding of the invention and for purposes of explanation and not limitation, specific details are set forth, such as a particular geometry of the deposition systems and the processing tool and descriptions of various components. However, it should be understood that the invention may be practiced in other embodiments that depart from these specific details.

According to an embodiment of the invention, a Ru layer can be deposited on the substrate in a chemical vapor deposition process by exposing the substrate to a ruthenium carbonyl precursor or a ruthenium organometallic precursor, but this is not required for the invention as other ruthenium-containing precursors capable of forming a Ru metal layer suitable for use as a layer for Cu metallization may be utilized.

According to an embodiment of the invention, the ruthenium-containing precursor can be a ruthenium carbonyl precursor such as $Ru_3(CO)_{12}$. According to another embodiment of the invention the ruthenium-containing precursor can be a ruthenium organometallic precursor such as (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), or (2,4-dimethylpentadienyl) (methylcyclopentadienyl) ruthenium. The above-mentioned organometallic precursors are not required for the invention, as other ruthenium organometallic precursors may be used, including the liquid precursor bis(ethylcyclopentadienyl) ruthenium (Ru(EtCp)$_2$), as well as combinations of these and other precursors.

Figure 1:
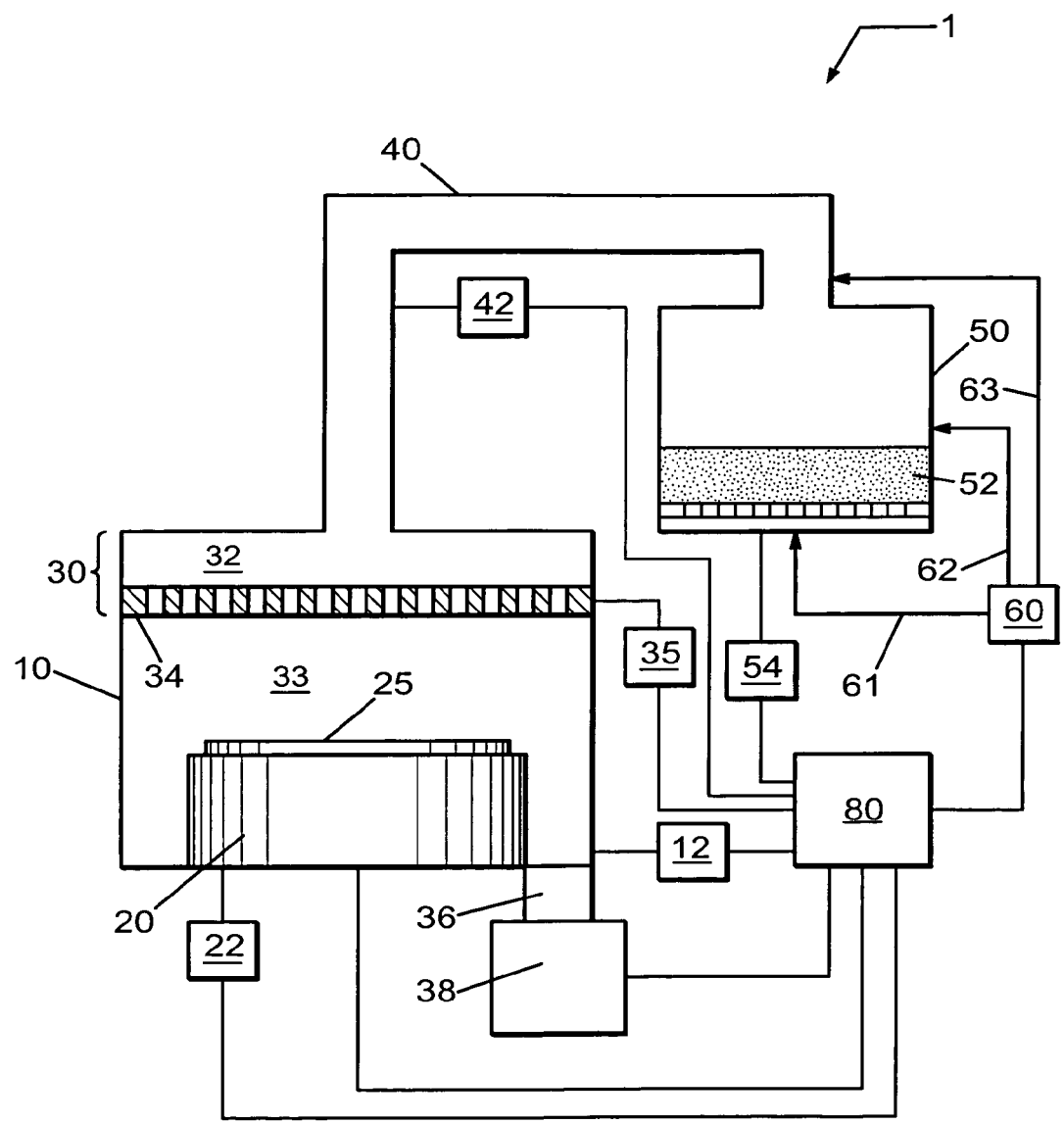
FIG. 1 depicts a schematic view of a deposition system according to an embodiment of the invention.

Referring now to the drawings, FIG. 1 illustrates a deposition system 1 for depositing a Ru metal layer on a substrate from a ruthenium-containing precursor according to one embodiment of the invention. The following sections describe the use of a ruthenium carbonyl precursor, $Ru_3(CO)_{12}$, however as described above, other ruthenium carbonyl precursors and ruthenium organometallic precursors may be used without departing from the scope of the invention. The deposition system 1 comprises a process chamber 10 having a substrate holder 20 configured to support a substrate 25 upon which the ruthenium metal layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the Ru metal layer on the substrate 25, and suitable for vaporization of the ruthenium carbonyl precursor 52 in the metal precursor vaporization system 50.

Still referring to FIG. 1, the metal precursor vaporization system 50 is configured to store a ruthenium carbonyl precursor 52, to heat the ruthenium carbonyl precursor 52 to a temperature sufficient for vaporizing the ruthenium carbonyl precursor 52, and to introduce ruthenium carbonyl precursor vapor to the vapor precursor delivery system 40. The ruthenium carbonyl precursor 52 ($Ru_3(CO)_{12}$) is a solid under the selected heating conditions in the metal precursor vaporization system 50, however, those skilled in the art will appreciate that other ruthenium carbonyl precursors and ruthenium organometallic precursors that are liquids under the selected heating conditions can be used without departing from the scope of the invention.

In order to achieve the desired temperature for subliming the solid ruthenium carbonyl precursor 52, the metal precursor vaporization system 50 is coupled to a vaporization temperature control system 54 configured to control the vaporization temperature. For instance, the temperature of the ruthenium carbonyl precursor 52 is generally elevated to approximately 40° C. to approximately 45° C. in conventional systems in order to sublime the $Ru_3(CO)_{12}$. At this temperature, the vapor pressure of the $Ru_3(CO)_{12}$, for instance, ranges from approximately 1 to approximately 3 mTorr. As the ruthenium carbonyl precursor 52 is heated to cause sublimation, a CO-containing gas can be passed over or through the ruthenium carbonyl precursor 52, or any combination thereof. The CO-containing gas contains CO and optionally an inert carrier gas, such as $N_2$, or a noble gas (i.e., He, Ne, Ar, Kr, or Xe), or a combination thereof.

For example, a gas supply system 60 is coupled to the metal precursor vaporization system 50, and it is configured to, for instance, supply CO, a carrier gas, or a mixture thereof, beneath the ruthenium carbonyl precursor 52 via feed line 61, or over the ruthenium carbonyl precursor 52 via feed line 62. In addition, or in the alternative, the gas supply system 60 is coupled to the vapor precursor delivery system 40 downstream from the metal precursor vaporization system 50 to supply the gas to the vapor of the ruthenium carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 500 sccm. Still alternately, the flow rate of the CO-containing gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 500 sccm.

Downstream from the metal precursor vaporization system 50, the process gas containing the ruthenium carbonyl precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the ruthenium carbonyl precursor vapor as well as condensation of the ruthenium carbonyl precursor vapor.

Referring again to FIG. 1, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

Once the process gas containing the ruthenium carbonyl precursor vapor enters the processing zone 33 of process chamber 10, the ruthenium carbonyl precursor vapor thermally decomposes upon adsorption at the substrate surface due to the elevated temperature of the substrate 25, and a Ru metal layer is formed on the substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Conventional systems have contemplated operating the metal precursor vaporization system 50, as well as the vapor precursor delivery system 40, within a temperature range of approximately 40° C. to approximately 45° C. for $Ru_3(CO)_{12}$ in order to prevent decomposition, which occurs at higher temperatures. For example, $Ru_3(CO)_{12}$ can decompose at elevated temperatures to form by-products, such as those illustrated below:

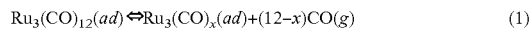

$$Ru_3(CO)_{12}(ad) \Leftrightarrow Ru_3(CO)_x(ad) + (12-x)CO(g) \quad (1)$$

or,

$$Ru_3(CO)_x(ad) \Leftrightarrow 3Ru(s) + xCO(g) \quad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, $Ru_3(CO)_{12}$ can condense on the internal surfaces of the deposition system 1, viz.

$$Ru_3(CO)_{12}(g) \Leftrightarrow Ru_3(CO)_{12}(ad) \quad (3).$$

In summary, low vapor pressure of some ruthenium carbonyl precursors (e.g., $Ru_3(CO)_{12}$) and the small process window, results in very low deposition rate of a metal layer on the substrate 25.

Adding a CO gas to the ruthenium carbonyl precursor vapor can reduce the above-mentioned problems that limit the delivery of the ruthenium carbonyl precursor to the substrate. Thus, according to an embodiment of the invention, the CO gas is added to the ruthenium carbonyl precursor vapor to reduce dissociation of the ruthenium carbonyl precursor vapor in the gas line, thereby shifting the equilibrium in Equation (1) to the left and reducing premature decomposition of the ruthenium carbonyl precursor in the vapor precursor delivery system 40 prior to delivery of the ruthenium carbonyl precursor to the process chamber 10. The addition of the CO gas to the ruthenium carbonyl precursor vapor allows for increasing the vaporization temperature from approximately 40° C. to approximately 100° C., or higher. The elevated temperature increases the vapor pressure of the ruthenium carbonyl precursor, resulting in increased delivery of the ruthenium carbonyl precursor to the process chamber and, hence, increased deposition rate of the metal on the substrate 25. Furthermore, flowing a mixture of Ar and the CO gas over or through the ruthenium carbonyl precursor reduces premature decomposition of the ruthenium carbonyl precursor.

According to an embodiment of the invention, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Since the addition of the CO gas to the ruthenium carbonyl precursor vapor increases the thermal stability of the ruthenium carbonyl precursor vapor, the relative concentration of the ruthenium carbonyl precursor vapor to the CO gas in the process gas can be utilized to control the decomposition rate of the ruthenium carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the ruthenium carbonyl precursor and for achieving a desired deposition rate of the ruthenium carbonyl precursor on the substrate 25.

Furthermore, the amount of CO gas in the process gas can be selected so that Ru metal deposition on the substrate 25 from a ruthenium carbonyl precursor occurs in a kinetic-limited temperature regime (also commonly referred to as a reaction rate limited temperature regime). For example, the amount of CO gas in the process gas can be increased until the Ru metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on ruthenium carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall.

Still referring to FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 2:
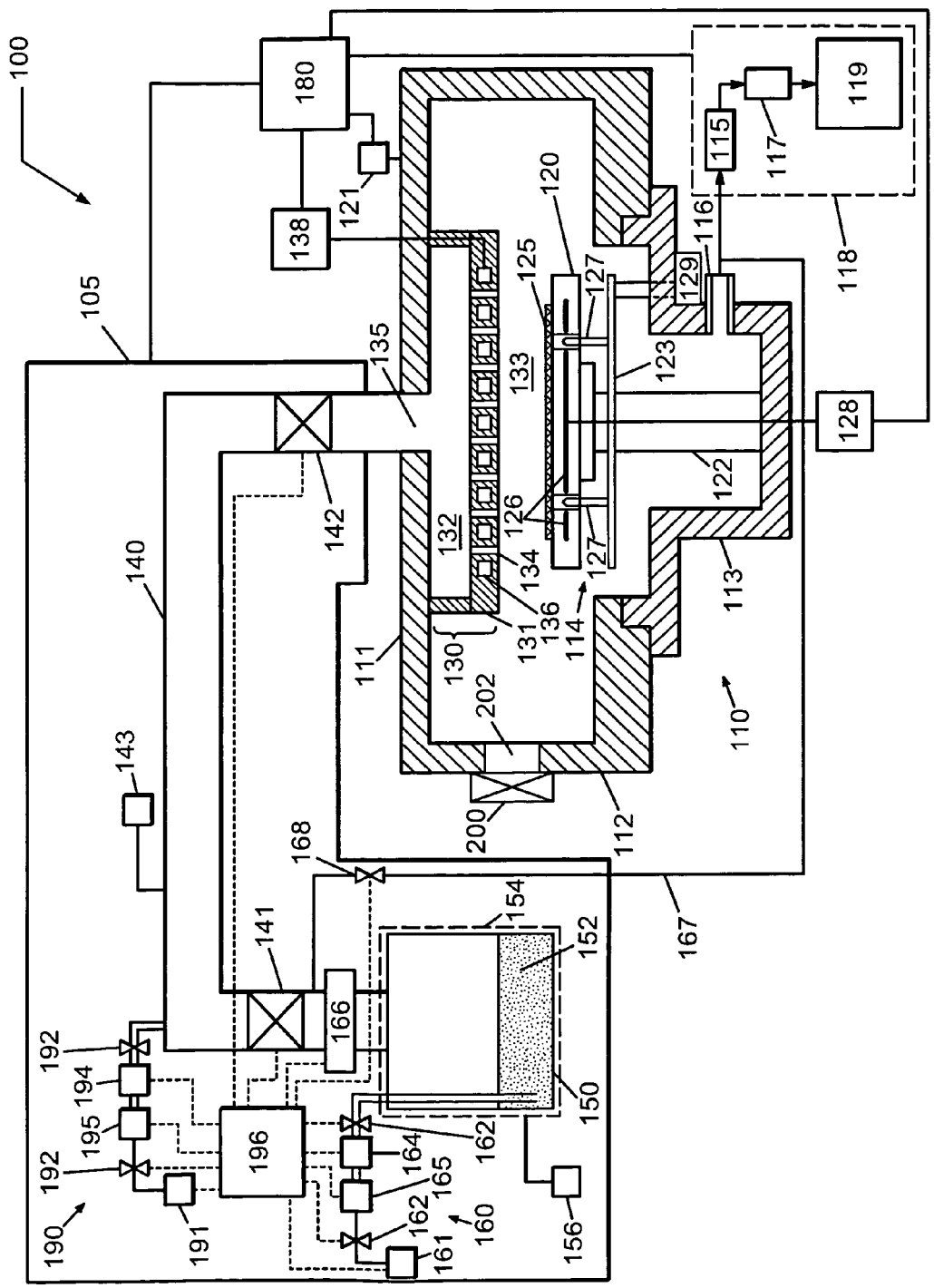
FIG. 2 depicts a schematic view of a deposition system according to another embodiment of the invention.

In another embodiment, FIG. 2 illustrates a deposition system 100 for depositing a metal layer, such as a Ru metal layer, on a substrate. The deposition system 100 comprises a process chamber 110 having a substrate holder 120 configured to support a substrate 125 upon which the Ru metal layer is formed. The process chamber 110 is coupled to a precursor delivery system 105 having metal precursor vaporization system 150 configured to store and vaporize a ruthenium carbonyl precursor 152, and a vapor precursor delivery system 140 configured to transport the vapor of the ruthenium carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the ruthenium carbonyl precursor vapor, and enable deposition of a Ru metal layer on the substrate 125. The substrate holder 120 is heated to a pre-determined temperature that is suitable for depositing the desired Ru metal layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 200 mTorr. Alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a ruthenium carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the ruthenium carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the plate 131.

As illustrated in FIG. 2, a metal precursor vaporization system 150 is configured to hold a ruthenium carbonyl precursor 152 and to evaporate (or sublime) the ruthenium carbonyl precursor 152 by elevating the temperature of the ruthenium carbonyl precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the ruthenium carbonyl precursor 152 to maintain the ruthenium carbonyl precursor 152 at a temperature that produces a desired vapor pressure of ruthenium carbonyl precursor 152. The precursor heater 154 is coupled to a vaporization temperature control system 156 configured to control the temperature of the ruthenium carbonyl precursor 152. For example, the precursor heater 154 can be configured to adjust the temperature of the ruthenium carbonyl precursor 152 from about 40° C. to about 150° C., or from about 60° C. to about 90° C.

As the ruthenium carbonyl precursor 152 is heated to cause evaporation (or sublimation), a CO-containing gas can be passed over or through the ruthenium carbonyl precursor 152, or any combination thereof. The CO-containing gas contains CO and optionally an inert carrier gas, such as $N_2$, or a noble gas (i.e., He, Ne, Ar, Kr, Xe). According to an embodiment of the invention, a CO gas can be added to the inert gas. Alternately, other embodiments contemplate the CO gas replacing the inert gas. For example, a gas supply system 160 is coupled to the metal precursor vaporization system 150, and it is configured to, for instance, flow the CO gas, the inert gas, or both, over or through the ruthenium carbonyl precursor 152. Although not shown in FIG. 2, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of ruthenium carbonyl precursor vapor delivered to the process chamber 110 can be determined using sensor 166 and mass flow controller 165. Alternately, the sensor 166 can comprise a light absorption sensor to measure the concentration of the ruthenium carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the ruthenium carbonyl precursor vapor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the ruthenium carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the ruthenium carbonyl precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the ruthenium carbonyl precursor vapor. Sensor 166 is also connected to controller 195 and, based on output of the sensor 166, controller 195 can control the carrier gas flow through mass flow controller 165 to obtain the desired ruthenium carbonyl precursor flow to the process chamber 110.

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted ruthenium carbonyl precursor material and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex.

The controller 180 may be implemented as a general purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet and a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

Figure 3:
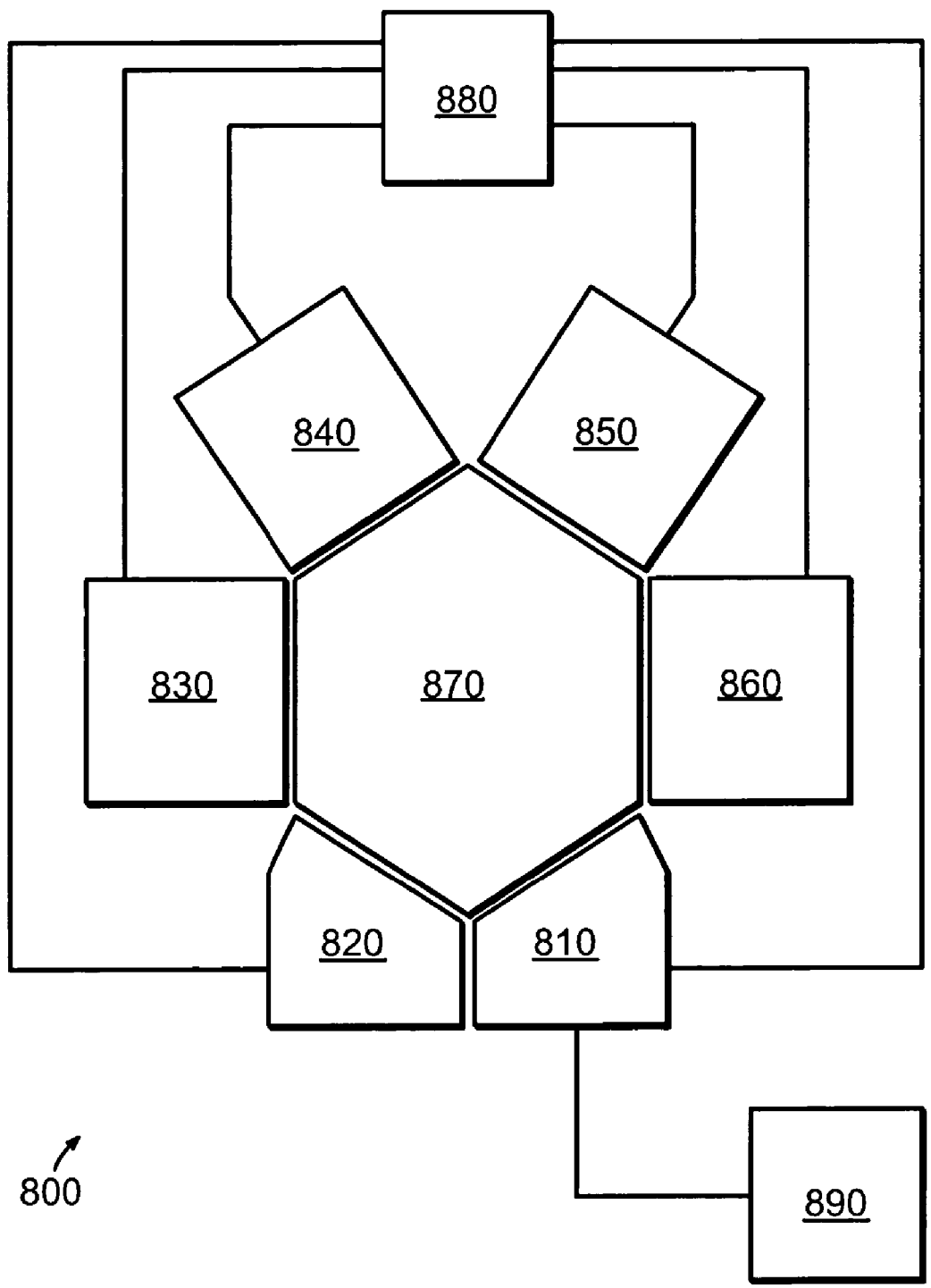
FIG. 3 depicts a schematic view of a processing tool for processing a substrate according to embodiments of the invention.

FIG. 3 schematically shows a processing tool for processing a substrate according to embodiments of the invention. The processing tool 800 contains substrate loading chambers 810 and 820, processing systems 830-860, robotic transfer system 870, and controller 880. In one embodiment of the invention, the processing system 840 can be configured for depositing a Ru metal layer on a substrate in a chemical vapor deposition process. The processing system 840 can, for example, be the deposition systems 1, 100 depicted in FIGS. 1 and 2.

The processing system 830 can, for example, be a plasma processing system configured for modifying the deposited Ru layer by exposure to an oxygen-containing plasma, or a nitrogen-containing plasma, or a combination thereof. Embodiments of the invention contemplate use of any plasma processing system capable of forming a plasma for exposing a Ru layer to a plasma. Several examples of plasma processing systems suitable for plasma exposing and annealing a Ru layer according to embodiments of the invention are described in U.S. patent application Ser. No. 11/045,124, titled "METHOD FOR FABRICATING A SEMICONDUCTOR DEVICE", filed on Jan. 31, 2005, the entire contents of which are hereby incorporated by reference. According to one embodiment of the invention, the processing system 830 can be a TRIAS™ SPA processing system from Tokyo Electron Limited, Akasaka, Japan. According to an embodiment of the invention, the processing system 830 can be further configured to treat the Ru layer by exposure to a hydrogen-containing plasma, and/or to anneal the substrate by heating and maintaining the substrate at a temperature between about 100° C. and about 500° C. Furthermore, the plasma processing system 830 can be configured for exposing the substrate to a noble gas, $O_2$ gas, $N_2$ gas, $NH_3$ gas, $H_2$ gas, or a combination of two or more thereof. As those skilled in the art will readily recognize, the plasma processing system 830 may also be utilized to clean the substrate of any oxide or contaminants before depositing a Ru layer onto the substrate.

According to one embodiment of the invention, an ultra thin Cu layer can be formed on the modified Ru layer in the processing system 850 prior to performing a Cu plating. The processing system 850 can be configured to carry out physical vapor deposition of an ultra thin Cu layer on the modified Ru layer and can, for example, be configured to carry out ionized physical vapor deposition (IPVD). IPVD systems for depositing a Cu metal layer onto a substrate are well known to those skilled in the art. One example of an IPVD system is described in U.S. Pat. No. 6,287,435.

A plating system 890 is operatively coupled to the processing tool 800 through the substrate loading chamber 810. The plating system 890 can, for example, be configured for performing an electrochemical or electroless plating process for plating a Cu layer onto a substrate containing the modified Ru layer or a substrate containing an ultra thin Cu layer formed on the modified Ru layer. Electrochemical and electroless plating systems are well known to those skilled in the art and are readily available commercially. Furthermore, the processing tool 800 can be configured to expose the substrate to air when transferring the substrate from the substrate loading chamber 810 to plating system 890. Alternately, the processing system 860 can be a Cu plating system. The processing system 860 can be configured to process a substrate without exposing the substrate to air.

The processing tool 800 can be controlled by a controller 880. The controller 880 can be coupled to and exchange information with substrate loading chambers 810 and 820, processing systems 830-860, and robotic transfer system 870. In one example, the controller 880 can further control the plating system 890. In another example, the plating system 890 can contain a separate controller for controlling the functions of the plating system 890. For example, a program stored in the memory of the controller 880 can be utilized to control the aforementioned components of the processing tool 800 according to a desired process, and to perform any functions associated with monitoring the process. One example of controller 880 is a DELL PRECISION WORKSTATION 610™, available from Dell Corporation, Austin, Tex.

Figure 4A:
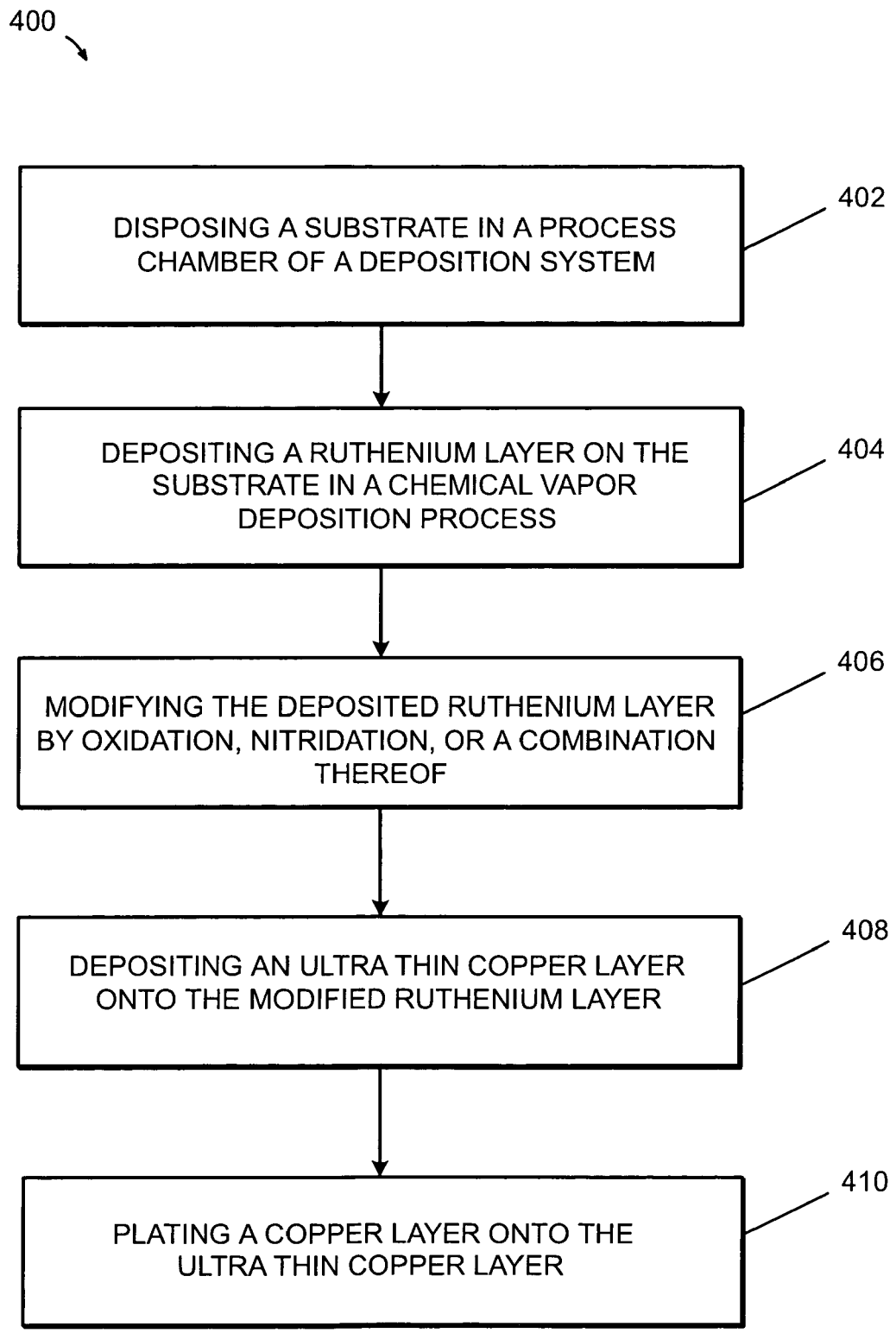
FIG. 4A is a flowchart for processing a substrate according to an embodiment of the invention.

FIG. 4A is a flowchart for processing a substrate according to an embodiment of the invention. Referring now to FIG. 4A and FIGS. 5A-5D, the process 400 includes, at 402, disposing a substrate 502 in a process chamber of a deposition system. The deposition system can, for example, include the depositions systems 1, 100 described above in FIGS. 1 and 2. Furthermore, the deposition system can be the processing system 840 of the processing tool 800 in FIG. 3. The substrate 502 can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, and as further described in FIGS. 5A-6D, the substrate can be a planar substrate or a patterned substrate containing one or more vias or trenches, or combinations thereof.

In step 404, a Ru layer 504 is deposited on the substrate 502 in a chemical vapor deposition process. Although not shown, the deposited Ru layer 504 may contain contaminants distributed within the Ru layer 504. It is contemplated that the contaminants may have the highest concentration near the top of the layer 504. The contaminants can, for example contain CO or reaction products (e.g., carbon and oxygen) from CO dissociation originating from dissociation of a ruthenium carbonyl precursor, such as a $Ru_3(CO)_{12}$ precursor. In addition, or in the alternative, the contaminants may be due to adsorption of CO or other gaseous species (e.g., $H_2O$) from the process environment onto the Ru layer 504 during or after the Ru deposition step 404. In the case of ruthenium organometallic precursors, the contaminants can, for example, include carbon species from dissociation of the precursor ligands, or adsorption of other gaseous species from the process environment onto the Ru layer 504. According to one embodiment of the invention, a thickness of the Ru layer 504 can be between about 1 nm and about 30 nm. According to another embodiment of the invention, a thickness of the Ru layer 504 can be between about 1.5 nm and about 10 nm.

According to one embodiment of the invention, the Ru layer 504 can be deposited by exposing the substrate to a process gas containing a ruthenium carbonyl precursor vapor and a CO gas. The ruthenium precursor can, for example, be $Ru_3(CO)_{12}$. The process gas can further contain an inert gas such as $N_2$ or a noble gas. The noble gas can include He, Ne, Ar, Kr, or Xe, or a combination of two or more thereof. The substrate can, for example, be maintained at a temperature between about 100° C. and about 400° C. during the exposing. Alternately, the substrate can be maintained at a temperature between about 150° C. and about 300° C. during the exposing. Furthermore, the process chamber can be maintained at a pressure between about 0.1 mTorr and about 200 mTorr during the exposing.

According to another embodiment of the invention, the Ru layer 504 can be deposited by exposing the substrate to a process gas containing a ruthenium organometallic precursor. The ruthenium organometallic precursor can, for example, be selected from any of the above-mentioned ruthenium organometallic precursors. The process gas can further contain an inert gas such as $N_2$ or a noble gas, a reducing gas (e.g., $H_2$ or $O_2$), or a combination thereof.

Figure 5A:
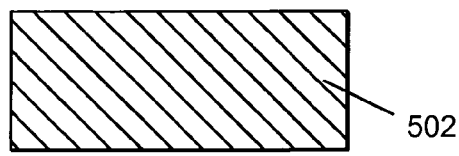
FIGS. 5A-5E schematically show formation of a plated Cu layer onto a treated Ru layer according to an embodiment of the invention.
Figure 5D:
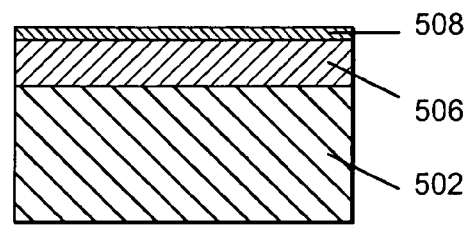
Figure 5B:
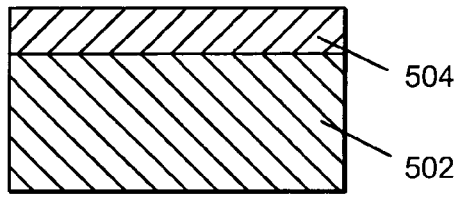
Figure 5E:
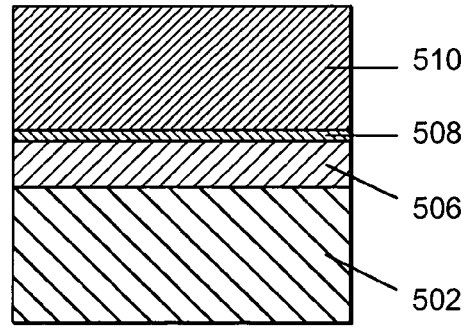
Figure 5C:
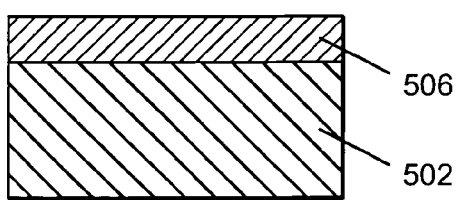

In step 406, the Ru layer 504 is modified by oxidation, or nitridation, or a combination thereof, to form a modified Ru layer 506, as shown in FIG. 5C. Step 406 may, for example, be carried out in processing system 830 of the processing tool 800 in FIG. 3. The current inventors have realized that modifying a deposited Ru layer 504 according to embodiments of the invention can reduce or eliminate problems encountered for an as-deposited Ru layer 504, including insufficient resistance to Cu diffusion through the Ru layer 504. It is contemplated that the modifying step 406 at least partially removes any contaminants from the Ru layer 504 and incorporates oxygen and/or nitrogen species into the Ru layer 504, thereby improving the barrier properties of the Ru layer 504. The modifying step 406 can be performed at a gas pressure between about 10 mTorr and about 1000 Torr. Alternately, the modifying step 406 can be performed at a gas pressure between about 100 mTorr and about 10 Torr.

According to an embodiment of the invention, the modifying step 406, can be carried out without annealing the substrate. According to another embodiment of the invention, the modifying step 406 can be carried out while annealing the substrate. According to yet another embodiment of the invention, the substrate may be annealed prior to or following the plasma exposing step 406. In one example, the annealing may at least partially overlap with the Ru deposition step 404. According to another embodiment of the invention, annealing of the substrate and the modifying in step 406 can at least partially overlap in time.

In step 408, an ultra thin Cu layer 508 shown in FIG. 5D is deposited on the modified Ru layer 506. The ultra thin Cu layer 508 can, for example, be deposited by IPVD using the processing system 850 in FIG. 3. The thickness of the ultra thin Cu layer 508 can, for example, between about 1 nm and about 30 nm. By way of further example, ultra thin Cu layer 508 can be between about 5 nm and about 20 nm. The ultra thin Cu layer 508 may be thinner than a conventional Cu seed layer used for Cu plating, where the thickness is commonly greater than about 50 nm.

In step 410, a bulk Cu layer 510 shown in FIG. 5E is plated on the ultra thin Cu layer 508 from step 408. The bulk Cu layer 510 can, for example, be plated using the processing system 860 or the plating system 890 described in FIG. 3.

As would be appreciated by those skilled in the art, each of the steps or stages in the flowchart of FIG. 4A may encompass one or more separate steps and/or operations. Accordingly, the recitation of only five steps in 402, 404, 406, 408, 410 should not be understood to limit the method of the present invention solely to five steps or stages. Moreover, each representative step or stage 402, 404, 406, 408, 410 should not be understood to be limited to only a single process.

Figure 4B:
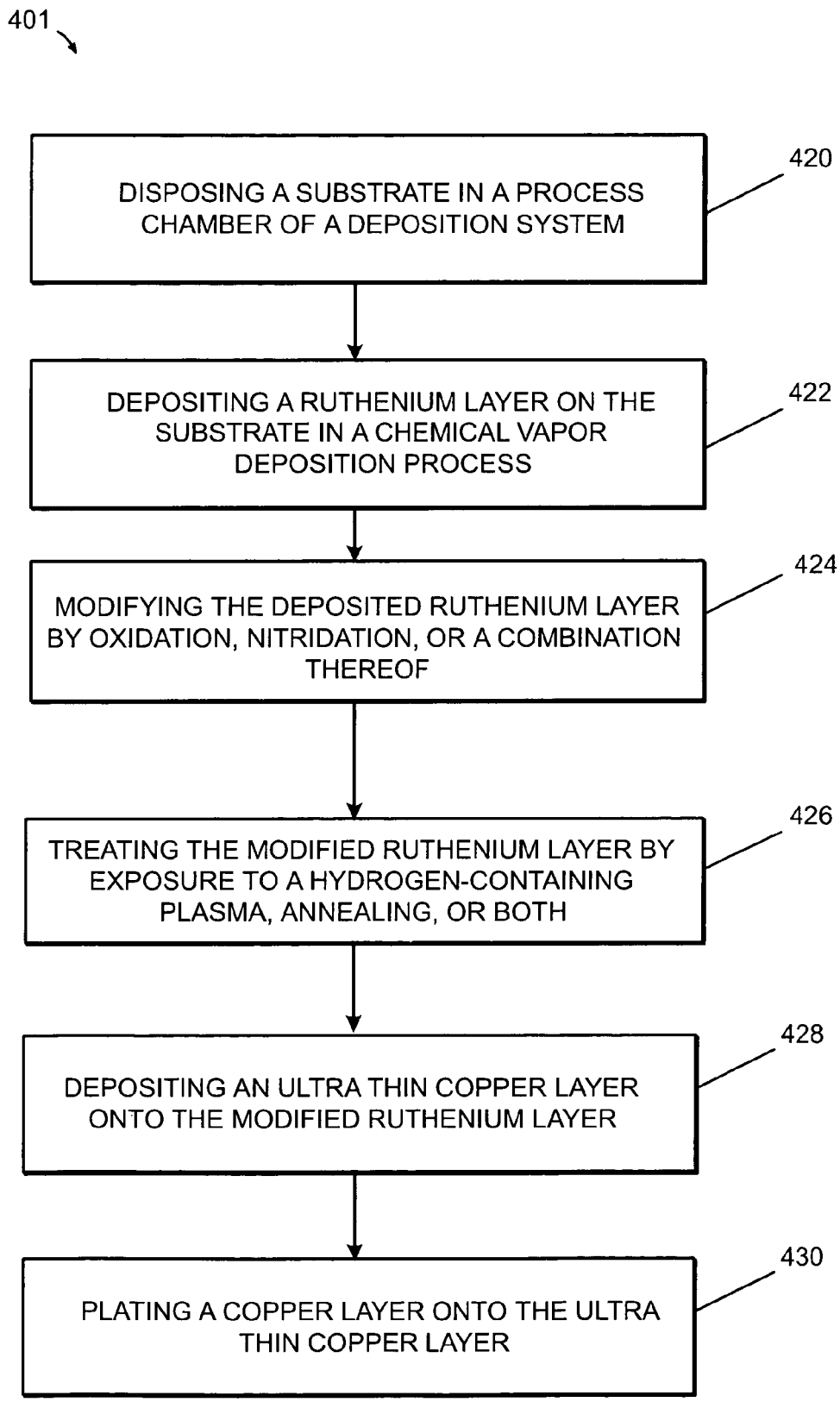
FIG. 4B is a flowchart for processing a substrate to another embodiment of the invention.

FIG. 4B is a flowchart for processing a substrate according to another embodiment of the invention. In FIG. 4B, the steps 420, 422, 424, 428 and 430 correspond to the steps 402, 404, 406, 408 and 410, respectively, described above in reference to FIG. 4A. In FIG. 4B, the process 401 includes, in step 426, treating the modified Ru layer by exposure to a hydrogen-containing plasma, annealing or both. According to an embodiment of the invention, the hydrogen-containing plasma can contain $H_2$. According to another embodiment of the invention, the hydrogen-containing plasma can contain $H_2$ and a noble gas. According to an embodiment of the invention, the annealing described above may be performed while exposing the Ru layer 504 to a noble gas, $N_2$ gas, $NH_3$ gas, $H_2$ gas, or a combination thereof.

As would be appreciated by those skilled in the art, each of the steps or stages in the flowchart of FIG. 4B may encompass one or more separate steps and/or operations. Accordingly, the recitation of only six steps in 420, 422, 424, 426, 428, 430 should not be understood to limit the method of the present invention solely to six steps or stages. Moreover, each representative step or stage 420, 422, 424, 426, 428, 430 should not be understood to be limited to only a single process.

In one embodiment of the invention, the processing tool 800 is configured for depositing a Ru layer 504 on a substrate in the processing system 840, plasma exposing the Ru layer 504 in the processing system 830, depositing an ultra thin Cu layer 512 on the modified Ru layer 506 in the processing system 850, and plating a Cu layer 510 onto the ultra thin Cu layer 508 in processing system 860 or plating system 890. Furthermore, the modified Ru layer 506 may be exposed to an oxygen-containing ambient (e.g., air) before, after, or before and after depositing the ultra thin Cu layer 508. Alternately, the processing tool 800 may be configured to prevent exposure of the modified Ru layer 506 to an oxygen-containing ambient before, after, or before and after depositing the ultra thin Cu layer 508.

In addition to improving adhesion of the plated bulk Cu layer 510 to the modified Ru layer 506, the use of an ultra thin Cu layer 508 can reduce the effect of the terminal ('resistive substrate') effect that is commonly encountered in electrochemical plating processing where a non-uniform thickness of the plated Cu layer over the whole substrate (wafer) is observed. The terminal effect is the tendency for the current density to be non-uniform as a result of the ohmic potential drop associated with conducting current from the substrate edge to the entire substrate surface through a thin resistive layer. This problem can be more severe for a highly resistive non-Cu (e.g., Ru) layer than a lower resistivity Cu layer. The sheet resistance of a non-Cu layer can be orders of magnitude higher than that of today's Cu seed layers and straightforward extension of methods currently used to manipulate current distribution (e.g., electrolyte conductivity) generally may not be adequate to combat the terminal effect experienced using a non-Cu seed layer.

Figure 6A:
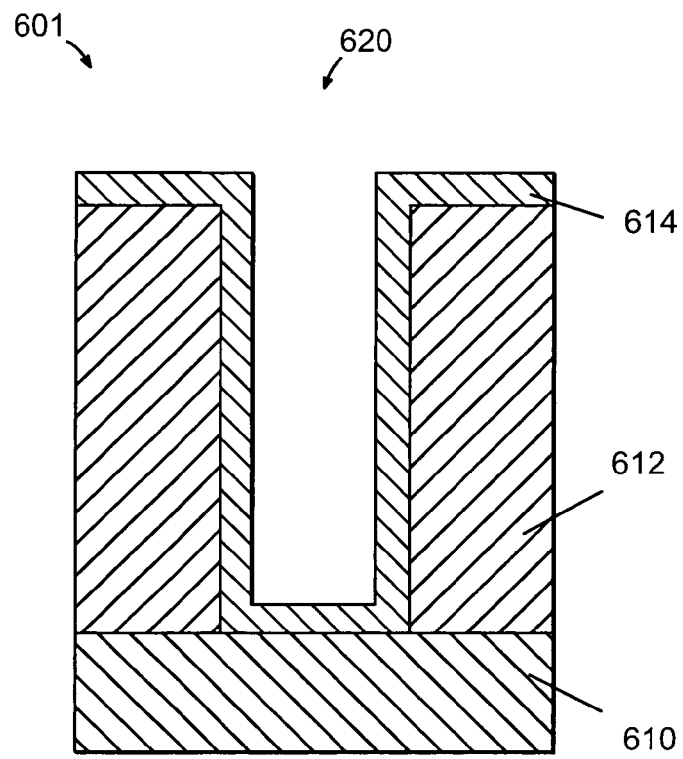
FIGS. 6A-6D schematically show formation of a plated Cu layer onto a patterned structure according to an embodiment of the invention.

FIGS. 6A-6D schematically show formation of a plated Cu layer onto a patterned structure according to an embodiment of the invention. As those skilled in the art will readily appreciate, embodiments of the invention can be applied to a variety of patterned structures and substrates containing one or more vias or trenches, or combinations thereof. FIG. 6A shows a patterned structure 601 containing a first metal layer 610 and a patterned layer 612 containing an opening 620. The patterned layer 612 can, for example, be a dielectric material. The structure 601 further contains a Ru layer 614 deposited on the patterned layer 612 and the first metal layer 610. Although not shown, those skilled in the art will appreciate that the patterned structure 601 can further contain an additional barrier layer (not shown) formed on the exposed surface of the patterned layer 612 and the first metal layer 610, underneath the Ru layer 614. The additional barrier layer can, for example, be a tantalum-containing layer (e.g., Ta, TaN, or TaCN, or a combination thereof) or a tungsten-containing layer (e.g., W, or WN, or a combination thereof).

Figure 6B:
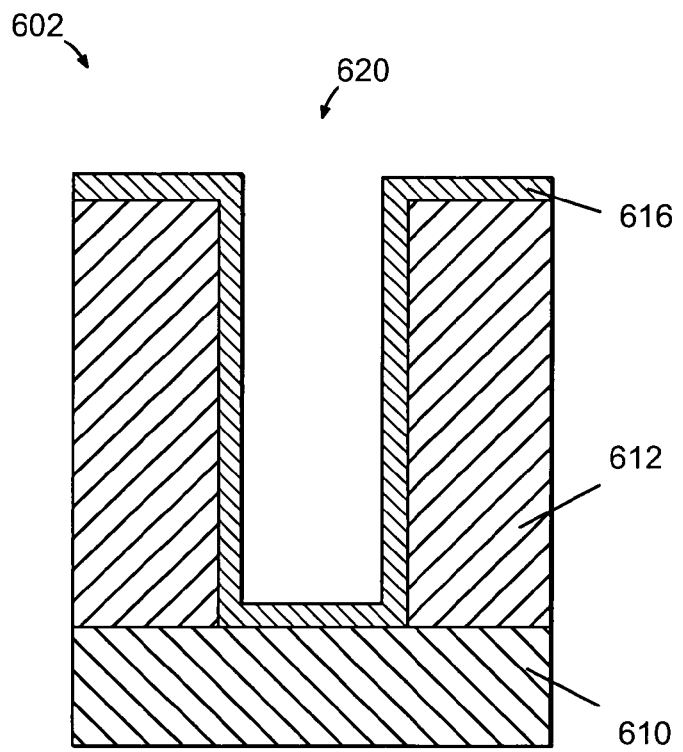

FIG. 6B shows a patterned structure 602 containing a modified Ru layer 616 formed by oxidation, or nitridation, or a combination thereof, of the patterned structure 601 of FIG. 6A according to an embodiment of the invention.

Figure 6C:
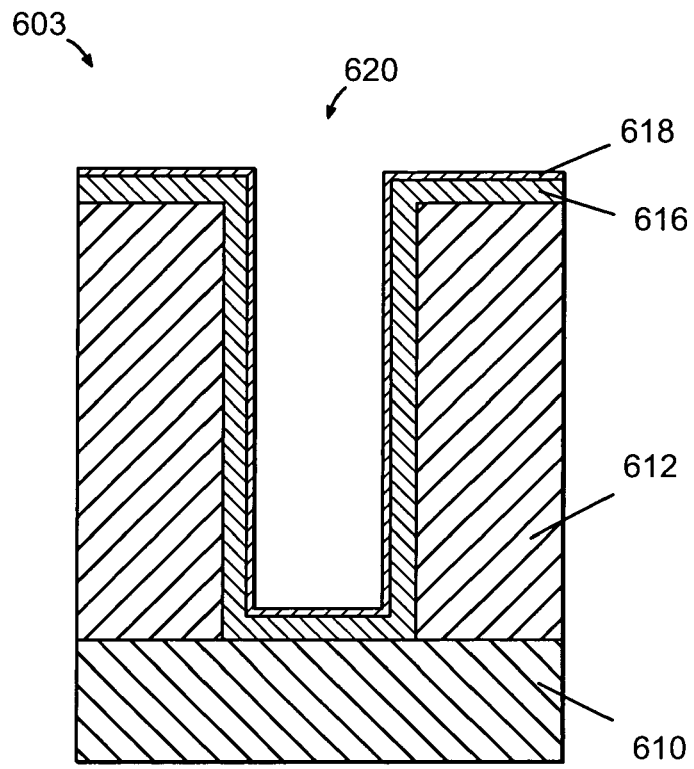

FIG. 6C shows a patterned structure 603 containing an ultra thin Cu layer 618 formed on the modified Ru layer 616.

Figure 6D:
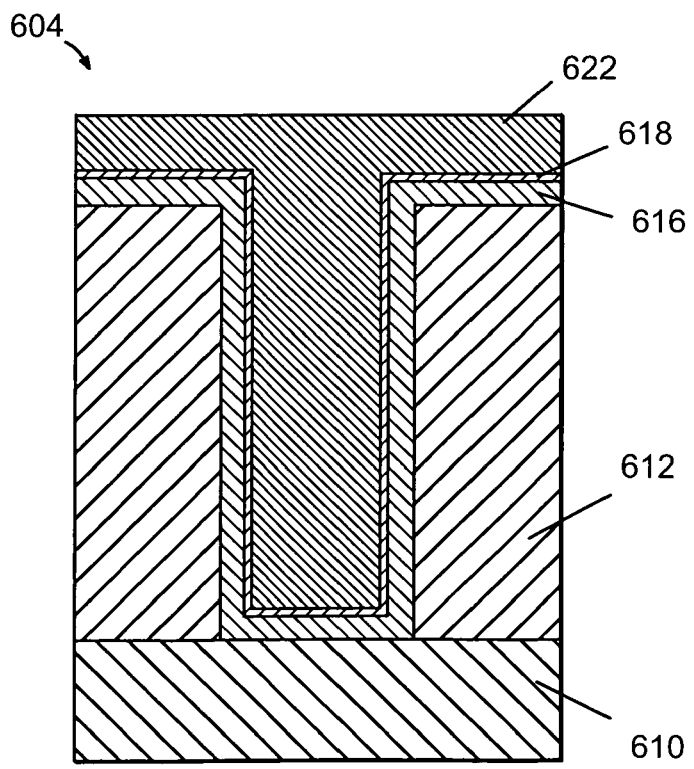

FIG. 6D shows a patterned structure 604 containing a plated Cu layer 622 formed by a Cu plating process onto the ultra-thin Cu layer 618.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for processing a substrate, comprising:
depositing a Ru metal layer onto the substrate in a chemical vapor deposition process;
thereafter, modifying the deposited Ru metal layer by nitridation to incorporate nitrogen species into the deposited Ru metal layer;
thereafter, treating the modified Ru metal layer by exposing the modified Ru metal layer to a hydrogen-containing plasma, or annealing the substrate, or a combination thereof;
thereafter, depositing an ultra thin Cu layer onto the modified and treated Ru metal layer; and
plating a bulk Cu layer onto the ultra thin Cu layer.

2. The method according to claim 1, wherein the depositing a Ru metal layer comprises:
exposing the substrate to a process gas comprising a ruthenium carbonyl precursor and CO gas.

3. The method according to claim 1, wherein the depositing a Ru metal layer comprises:
exposing the substrate to a process gas comprising $Ru_3(CO)_{12}$ and CO gas.

4. The method according to claim 1, wherein the depositing a Ru metal layer comprises:
exposing the substrate to a process gas comprising a ruthenium organometallic precursor and a reducing gas.

5. The method according to claim 4, wherein the ruthenium organometallic precursor comprises (2,4-dimethylpentadienyl) (ethylcyclopentadienyl) ruthenium, bis(2,4-dimethylpentadienyl) ruthenium, (2,4-dimethylpentadienyl) (methylcyclopentadienyl) ruthenium, or bis(ethylcyclopentadienyl) ruthenium, or a combination of two or more thereof.

6. The method according to claim 4, wherein the reducing gas comprises $H_2$ or $O_2$.

7. The method according to claim 1, wherein the depositing a Ru metal layer further comprises:
maintaining the substrate at a temperature between about 100° C. and about 400° C.

8. The method according to claim 1, wherein the depositing a Ru metal layer is performed at a process pressure between about 0.1 mTorr and about 200 mTorr.

9. The method according to claim 1, wherein a thickness of the Ru metal layer is between about 1 nm and about 30 nm.

10. The method according to claim 1, wherein a thickness of the Ru metal layer is between about 1.5 nm and about 10 nm.

11. The method according to claim 1, wherein the modifying by nitridation comprises exposing the Ru metal layer to a nitrogen-containing plasma.

12. The method according to claim 11, wherein the nitrogen-containing plasma comprises $N_2$ gas or $NH_3$ gas, and a noble gas.

13. The method according to claim 1, wherein the modifying is performed at a gas pressure between about 10 mTorr and about 1000 Torr.

14. The method according to claim 1, wherein the modifying is performed at a substrate temperature between about 100° C. and about 500° C.

15. The method according to claim 1, wherein the hydrogen-containing plasma comprises $H_2$ gas and a noble gas.

16. The method according to claim 1,
wherein the treating is by annealing the substrate in the absence of a plasma at a substrate temperature between about 100° C. and about 500° C. while exposing the modified Ru metal layer to a noble gas, $N_2$ gas, $NH_3$ gas, $H_2$ gas, or a combination of two or more thereof.

17. The method according to claim 1, wherein the ultra thin Cu layer is deposited by an ionized physical vapor deposition process.

18. The method according to claim 1, wherein a thickness of the ultra thin Cu layer is between about 1 nm and about 30 nm.

19. The method according to claim 1, wherein a thickness of the ultra thin Cu layer is between about 5 nm and about 20 nm.

20. A non-transitory computer readable medium containing program instructions for execution on a processor, which when executed by the processor, cause a processing tool to perform the steps in the method recited in claim 1.

21. A method for processing a substrate, comprising:
depositing a Ru metal layer onto the substrate in a chemical vapor deposition process from a process gas comprising $Ru_3(CO)_{12}$ and CO gas, the Ru metal layer having a thickness between about 1 nm and about 30 nm;
thereafter, modifying the deposited Ru metal layer by nitridation to incorporate nitrogen species into the deposited Ru metal layer;
thereafter, treating the modified Ru metal layer by exposing the modified Ru metal layer to a plasma comprising $H_2$ gas and a noble gas, or annealing the substrate in the absence of a plasma at a substrate temperature between about 100° C. and about 500° C. while exposing the modified Ru metal layer to a noble gas, $N_2$ gas, $NH_3$ gas, or $H_2$ gas, or a combination of two or more thereof;
thereafter, depositing an ultra thin Cu layer onto the modified and treated Ru metal layer, the ultra thin Cu layer having a thickness between about 1 nm and about 30 nm; and
plating a Cu layer onto the ultra thin Cu layer.

* * * * *